United States Patent
Sung et al.

(10) Patent No.: US 6,617,204 B2
(45) Date of Patent: Sep. 9, 2003

(54) METHOD OF FORMING THE PROTECTIVE FILM TO PREVENT NITRIDE READ ONLY MEMORY CELL CHARGING

(75) Inventors: Jiann-Long Sung, Taipei (TW); Chen-Chin Liu, Yunlin (TW); Li-Yeh Chou, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/927,529

(22) Filed: Aug. 13, 2001

(65) Prior Publication Data

US 2003/0032224 A1 Feb. 13, 2003

(51) Int. Cl.$^7$ ............... H01L 21/336; H01L 21/8234
(52) U.S. Cl. ........................ 438/197; 438/230
(58) Field of Search .................. 438/197, 221, 438/230, 242, 243, 244, 264, 262, 294

(56) References Cited

U.S. PATENT DOCUMENTS 5,200,354 A  * 4/1993 Om et al.
5,817,557 A  * 10/1998 Baldi

* cited by examiner

*Primary Examiner*—Phuc T. Dang

(57) ABSTRACT

A method of forming a protective film to prevent a nitride read only memory is disclosed. In the method of the present invention, the protective layers are formed in the inter-level dielectrics (ILD)/inter-metal dielectrics (IMD) layer of the nitride read only memory cell, and the protective layers can prevent the nitride read only memory cell from being penetrated by the ultra-violet light or plasma, and avoid increasing the ion mobility to cause the charge gain during the process that affects the stability of the electricity of the nitride read only memory cell. Additionally, the threshold voltage of the nitride read only memory cell can decrease to expand the range of the threshold voltage.

8 Claims, 2 Drawing Sheets

METHOD OF FORMING THE PROTECTIVE FILM TO PREVENT NITRIDE READ ONLY MEMORY CELL CHARGING

FIELD OF THE INVENTION

The present invention relates to a method of forming a protective film to prevent a nitride read only memory cell charging, and more particularly, to a method of forming a nitride read only memory cell that the protective layers are formed in the inter-level dielectrics (ILD)/inter-metal dielectrics (IMD) layer.

BACKGROUND OF THE INVENTION

Referring to FIG. 1, it shows a cross-sectional view of the structure of the conventional nitride read only memory cell. The forming of the nitride read only memory cell, firstly the active area is defined on the substrate 100 by using photolithography and such methods as the wet etching. The phosphorous ions ($P^-$) are doped into the substrate 100 by using the ion implantation to form the channel 124. The first oxide layer 102, the nitride layer 104, and the second oxide layer 106 are deposited on the substrate 100 in turn, and the nitride layer 104 is located between the first oxide layer 102 and the second oxide layer 106. The first oxide layer 102, the nitride layer 104, and the second oxide layer 106 are defined by using the photolithography and the etching process to form an oxide/nitride/oxide (ONO) structure 108 and expose the substrate 100.

The polysilicon layer 110 is deposited to cover the second oxide layer 106, and the silicide layer 112 is deposited to cover the polysilicon layer 110, then the polysilicon layer 110 and the silicide layer 112 are defined to expose the second oxide layer 106 by using photolithography and the etching process similarly, so that the gate 114 is formed. Next, a material layer, such as the tetra-ethyl-ortho-silicate (TEOS), the silicon dioxide ($SiO_2$), or the silicon nitride ($Si_3N_4$) etc., is deposited, such as by the chemical vapor deposition (CVD) to cover the substrate 100, the second oxide layer 106, and the silicide layer 112. The material layer is defined by using photolithography and the anisotropic etching process to form the spacer 116.

Subsequently, the heavy highly concentrated doping and great depth is executed on the substrate 100 by using the structure consisted of the spacer 116 and the gate 114 as the mask, and the phosphorous (P) or the arsenic (As) that has greater solid solubility to the silicon (Si) as the ion source, so that the drain 122 and the source 126 are formed. An insulated layer 118 is deposited to cover the substrate 100, the spacer 116, and the silicide layer 112, and the ILD/IMD layer 120 is deposited to cover the insulated layer 118. Developed to this present, the nitride read only memory cell structure is completed.

For the following process, such as ultra-violet light or plasma usually penetrates through the nitride read only memory device to excite the atoms, so that the nitride read only memory device electrical instability results and damages the nitride read only memory device, or increases the ion mobility to cause the charge gain during the process, enhancing the threshold voltage, and affecting the stability of the device.

SUMMARY OF THE INVENTION

According to the conventional method of forming the nitride read only memory cell, there is no protective structure formed, so on the following process, the nitride read only memory cell may be penetrated through by the ultra-violet light or the plasma, and may increase the ion mobility to cause the charge gain, so that nitride read only memory cell damage will result and also result in the nitride read only memory cell electrical instability.

Accordingly, one aspect of the invention is to provide a method of forming the protective form to prevent a nitride read only memory cell charging. For nitride read only memory cell formation, the method of the present invention forms the protective layers to avoid the ultra-violet light and the plasma penetrating through the nitride read only memory device, to prevent the ion mobility increasing, and to keep the electricity's stability.

Another aspect of the invention is to provide a method of forming the protective film to prevent a nitride read only memory cell charging. For nitride read only memory cell formation, the method of the present invention forms one or a plurality of protective layers in the ILD/IMD layer to avoid the charge gain during the process, increasing the ion mobility, and the ultra-violet light or the plasma penetrating, so to enhance the electricity's stability of the device, decrease the nitride read only memory device's threshold voltage, and expand the threshold voltage range.

For at least the foregoing aspects discussed above, the present invention provides a method of forming the protective film to prevent a nitride read only memory cell charging. The present invention's method adds one or a plurality of protective layers, such as the silicon nitride ($SiN_x$) layer or the silicon-oxy-nitride (SiON) layer, and the protective layers can resist the ultra-violet light illumination and the invading plasma, so that the nitride read only memory device cannot be excited to discharge in order to the ultra-violet light and the plasma, and decrease the device's threshold voltage, so the device's electricity can be controlled and kept constant.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In contrast with the flash memory and the erasable programmable read only memory (EPROM), the nitride read only memory cell can't be erased to the initial state by the ultra-violet light, but the ultra-violet light's illumination excites the nitride read only memory cell's atoms to result in the nitride read only memory cell's electrical instability, and damage the device, therefore there is a need to isolate the nitride read only memory cell from the ultra-violet light.

Additionally, the nitride read only memory cell can be invaded by plasma ions during process to increase the charges of the nitride read only memory cell, so that the nitride read only memory cell's electrical stability is affected similarly and damaged. Therefore, the nitride read only memory cell needs a protective structure to prevent the penetrating of the ultra-violet light and the plasma ions, and to maintain the chargers of the nitride read only memory cell.

Figure 1:
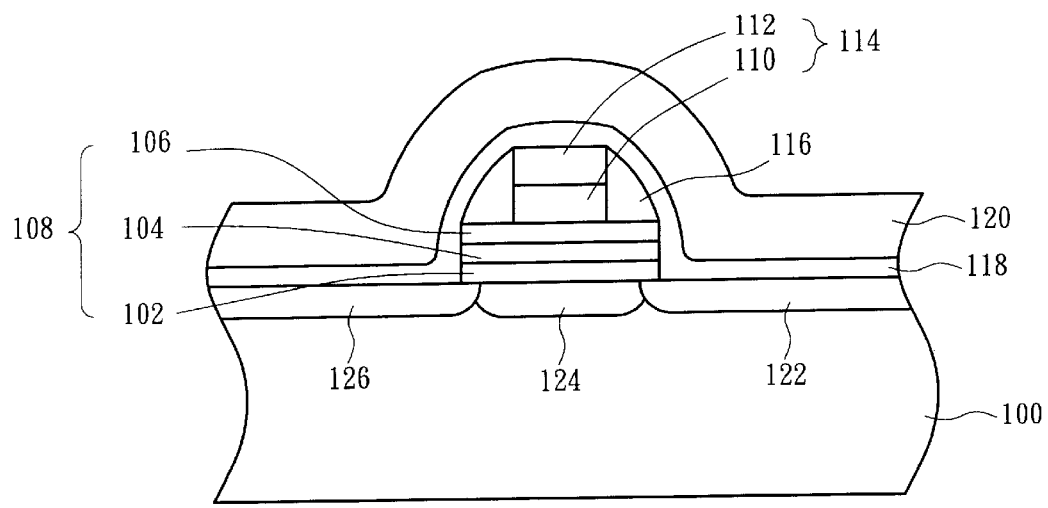
FIG. 1 is a cross-sectional view of the structure of the conventional nitride read only memory cell.
Figure 2:
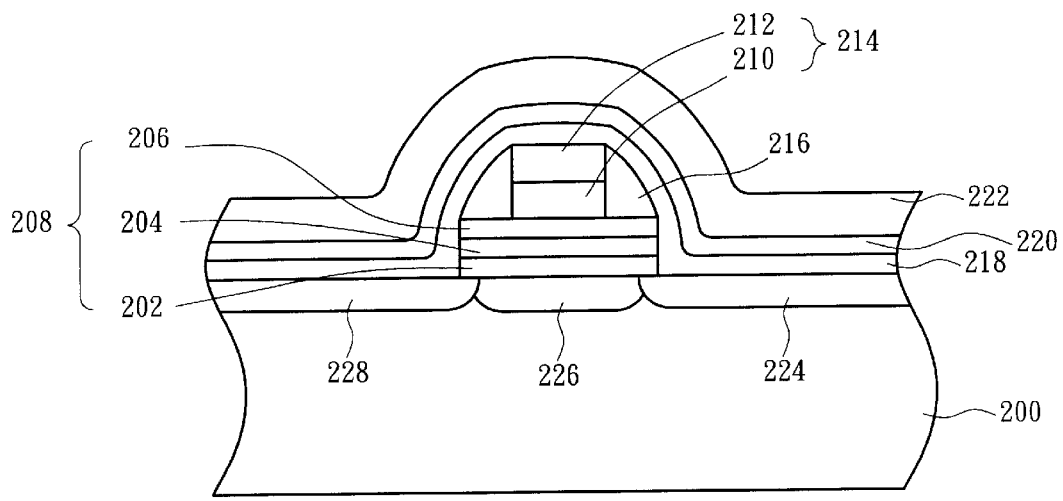
FIG. 2 is a cross-sectional view of the structure of the nitride read only memory cell in accordance with a preferred embodiment of the present invention.

Referring to FIG. 2, it shows a cross-sectional view of the structure of the nitride read only memory cell in accordance with a preferred embodiment of the present invention. On the formation of the nitride read only memory cell, the active area is defined first on the substrate 200 by using photolithography and the etching method, such as the wet etching method, and the phosphorous ions (P⁻) are doped into the substrate 200 by using the ion implantation to form the channel 226. Subsequently, the first oxide layer 202, the nitride layer 204, and the second oxide layer 206 are deposited on the substrate 200 in turn, and the nitride layer 204 is located between the first oxide layer 202 and the second oxide layer 206. The first oxide layer 202, the nitride layer 204, and the second oxide layer 206 are defined by using photolithography and the etching process to form an oxide/nitride/oxide (ONO) structure 208 and expose the substrate 200.

Then, the polysilicon layer 210 is deposited to cover the second oxide layer 206 such as by the low pressure chemical vapor deposition (LPCVD), and the silicide layer 212, such as tungsten silicide ($WSi_2$) or titanium silicide ($TiSi_2$), is deposited to cover the polysilicon layer 210 such as by the LPCVD. The polysilicon layer 210 and the silicide layer 212 are defined to expose the second oxide layer 206 by using photolithography and the etching process similarly, so that the gate 214 is formed. Next, a material layer, such as the tetra-ethyl-ortho-silicate (TEOS), the silicon dioxide ($SiO_2$), or the silicon nitride ($Si_3N_4$) etc., is deposited by such as the CVD to cover the substrate 200, the second oxide layer 206, and the gate 214. The material layer is defined by using the photolithography and the anisotropic etching process to form the spacer 216 on the sidewall of the gate 214.

Subsequently, the heavy doping of higher concentration and greater depth is executed on the substrate 200 by using the structure consisted of the spacer 216 and the gate 214 as the mask, and the phosphorous (P) or the arsenic (As) that has greater solid solubility to the silicon (Si) as the ion source, to dope the nitrogen ions (N⁺) into the substrate 200, so that the drain 224 and the source 228 are formed. An insulated layer 218 is deposited to cover the substrate 200, the spacer 216, and the gate 214, and the protective layer 220, such as the silicon nitride ($SiN_x$) or the silicon-oxynitride (SiON) etc., is deposited to cover the insulated layer 218, wherein the protective layer 220 can prevent the penetrating of the ultra-violet light and the plasma. Next, the ILD/IMD layer 222 is deposited.

Because the aforementioned method of forming the protective film to prevent the nitride read only memory cell charging forms a protective layer 220 that can protect the nitride read only memory cell to resist the ultra-violet light's illumination and the invading plasma, and avoid affecting the nitride read only memory cell's electricity. Therefore, the stability of the nitride read only memory cell can be maintained, and the threshold voltage of the device can decrease to about less than 0.2 volts, so that the range of the threshold voltage can expand.

Figure 3:
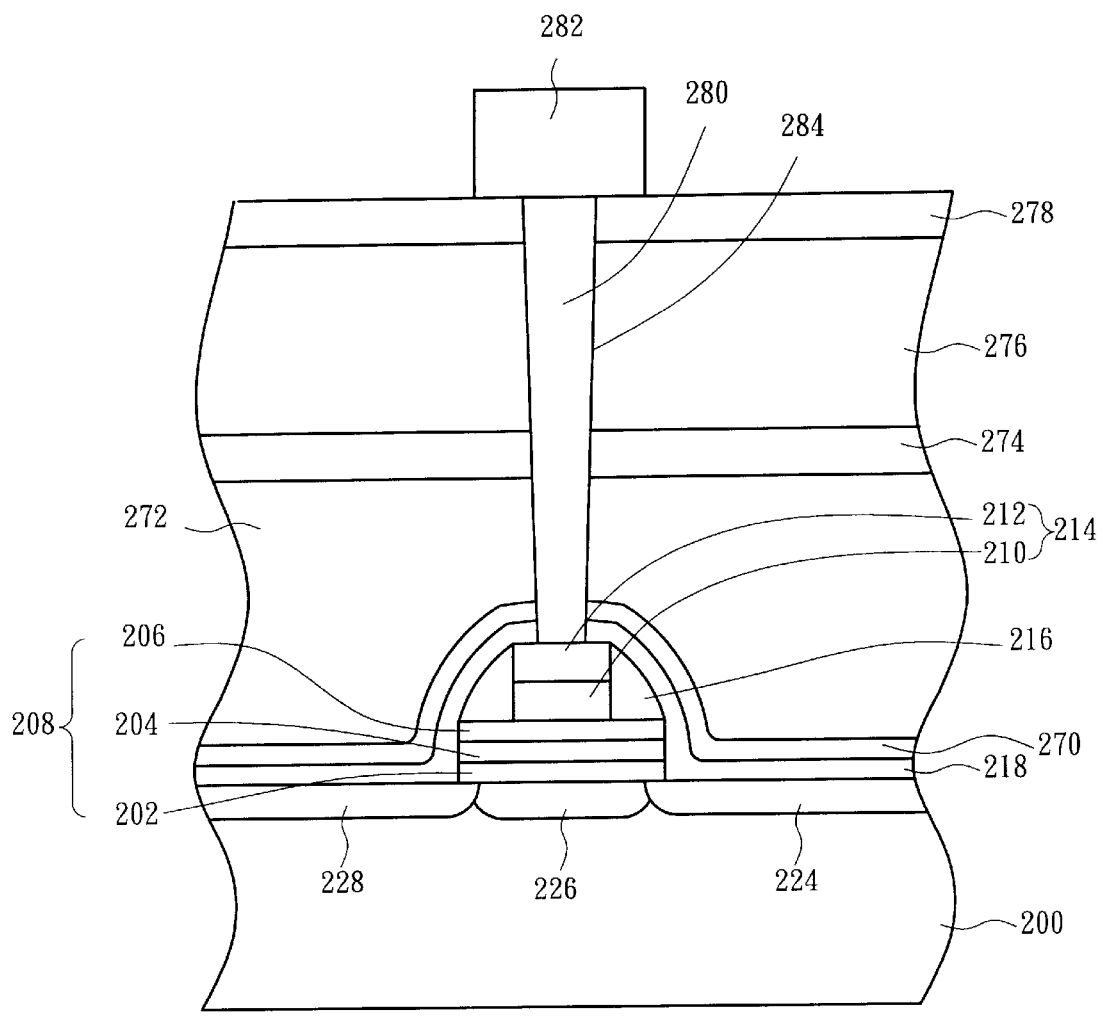
FIG. 3 is a cross-sectional view of the structure of the nitride read only memory cell in accordance with another preferred embodiment of the present invention.

Referring to FIG. 3, it shows a cross-sectional view of the structure of the nitride read only memory cell in accordance with another present invention preferred embodiment. The structure of the nitride read only memory cell is to deposit the first protective layer 270 on the insulated layer 218 of the nitride read only memory cell structure in FIG. 2, and deposit the first ILD/IMD layer 272 to cover the first protective layer 270. Next, the second protective layer 274 is deposited to cover the first ILD/IMD layer 272, the second ILD/IMD layer 276 is deposited to cover the second protective layer 274, and the third protective layer 278 is deposited to cover the second ILD/IMD layer 276, wherein the material of the first protective layer 270, the second protective layer 274, and the third protective layer 278 can be the silicon nitride ($SiN_x$) or the silicon-oxy-nitride (SiON), etc. Then, the insulated layer 218, the first protective layer 270, the first ILD/IMD layer 272, the second protective layer 274, the second ILD/IMD layer 276, and the third protective layer 278 are defined to form the contact/via 284 and expose the gate 214 by using the photolithography and the etching process, and the plug 280 is formed on the contact/via 284, such as tungsten (W). Afterward, a metal layer 282 is deposited to cover the third protective layer 278 and the plug 280.

Because the aforementioned nitride read only memory structure has formed three protective layers between the ILD/IMD layers, i.e. the first protective layer 270, the second protective layer 274, and the third protective layer 278, so the nitride read only memory structure has more protection to resist the ultra-violet light penetration, plasma, and keep the device's stability.

According to the preferred embodiments of the present invention, while the process permits, there can be a plurality of protective layers formed in the nitride read only memory of the present invention, and the number of the protective layers is not limited. Furthermore, the locations of the protective layers are not limited while the protective layers are between the ILD/IMD layers and the insulated layer of the nitride read only memory.

The advantage of the present invention is to provide a method of forming the nitride read only memory having the protective structure. The method of the present invention forms at least one protective layer, such as the silicon nitride ($SiN_x$) or the silicon-oxy-nitride (SiON), to prevent the ultra-violet light illumination and the plasma from invading during the process, and to prevent the device's excitement, and inducing the charges that increases the ion mobility. Therefore, the application of the present invention can resist the ultra-violet light and the plasma penetration through the nitride read only memory cell, so it is not only can avoid increasing the ion mobility to maintain the stability of the electricity of the nitride read only memory device, but also can decrease the threshold voltage to expand the threshold voltage range.

As is understood by a person skilled in the art, the foregoing preferred embodiments of the present invention are illustrations of the present invention rather than limitations of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming a protective film to prevent a nitride read only memory cell charging, comprising:

providing a substrate having an oxide/nitride/oxide (ONO) structure formed thereon;

forming a gate to cover portion of the oxide/nitride/oxide structure;

forming a spacer in both sides of the gate and covers the other portion of the oxide/nitride/oxide structure;

forming an insulated layer to cover the substrate, the gate, and the spacer; and forming a protective layer of a non-conductive material to cover the insulated layer.

2. The method according to claim 1, wherein the material of the protective layer is the silicon nitride ($SiN_x$).

3. The method according to claim 1, wherein the material of the protective layer is the silicon-oxy-nitride (SiON).

4. The method according to claim 1, wherein the gate includes a polysilicon layer and a silicide layer.

5. A method of forming a protective film to prevent a nitride read only memory cell charging, comprising:

provided a substrate having an oxide/nitride/oxide (ONO) structure formed thereon;

forming a gate to cover portion of the oxide/nitride/oxide structure;

forming a spacer on two sides of the gate and covers the other portion of the oxide/nitride/oxide structure;

forming an insulated layer to cover the substrate, the gate, and the spacer;

forming a first protective layer to cover the insulated layer;

forming an inter-level dielectrics (ILD)/inter-metal dielectrics (IMD) layer to cover the first protective layer; and forming a second protective layer to cover the inter-level dielectrics/inter-metal dielectrics layer.

6. The method according to claim 5, wherein the materials of the protective layers are the silicon nitride ($SiN_x$).

7. The method according to claim 5, wherein the materials of the protective layers are the silicon-oxy-nitride (SiON).

8. A method of forming a protective film to prevent a nitride read only memory cell charging, comprising:

providing a substrate having an oxide/nitride/oxide (ONO) structure formed thereon;

forming a gate to cover portion of the oxide/nitride/oxide structure;

forming a spacer on two sides of the gate and covers the other portion of the oxide/nitride/oxide structure;

forming an insulated layer to cover the substrate, the gate, and the spacer;

forming a first protective layer to cover the insulated layer;

forming a first inter-level dielectrics/inter-metal dielectrics layer to cover the first protective layer;

forming a second protective layer to cover the first inter-level dielectrics/inter-metal dielectrics layer;

forming a second inter-level dielectrics/inter-metal dielectrics layer to cover the second protective layer; and forming a third protective layer to cover the second inter-level dielectrics/inter-metal dielectrics layer.

* * * * *